United States Patent [19]

Sawata et al.

[11] Patent Number: 4,769,613

[45] Date of Patent: Sep. 6, 1988

[54] DIGITALIZED AMPLITUDE DETECTION CIRCUIT FOR ANALOG INPUT SIGNAL

[75] Inventors: Hisashi Sawata; Yasuharu Tomimitsu, both of Tokyo, Japan

[73] Assignee: NEC Corporation, Japan

[21] Appl. No.: 937,900

[22] Filed: Dec. 4, 1986

[30] Foreign Application Priority Data

Dec. 5, 1985 [JP] Japan ................................ 60-274504
Jun. 3, 1986 [JP] Japan ................................ 61-129572

[51] Int. Cl.$^4$ .............................................. H03D 1/00
[52] U.S. Cl. ..................................... 329/168; 328/149
[58] Field of Search ............... 329/106, 109, 135, 168; 328/28, 135, 146, 149, 150; 324/177 A; 455/337; 375/94

[56] References Cited

U.S. PATENT DOCUMENTS 4,370,620 1/1983 Tin .................................. 455/337 X
4,463,431 7/1984 Schumaker ..................... 328/149 X Primary Examiner—Eugene R. LaRoche
Assistant Examiner—Robert J. Pascal
Attorney, Agent, or Firm—Laff, Whitesel, Conte & Saret

[57] ABSTRACT

A digitalized detection circuit as an envelope detector of an analog input signal is disclosed. This circuit includes an analog-to-digital converter converting the analog input signal into first digital data, storing means for storing second digital data to be outputted, and a comparator comparing the first and second digital data. When the first digital data is equal to or larger (smaller) than the second data, the first digital data is supplied to the storing means, and when the former is smaller (larger) than the latter, the storing means receives cyclically third data that is the second data minus (plus) a predetermined value. A digitalized peak or bottom envelope detector is thereby obtained.

6 Claims, 5 Drawing Sheets

DIGITALIZED AMPLITUDE DETECTION CIRCUIT FOR ANALOG INPUT SIGNAL

BACKGROUND OF THE INVENTION

The present invention relates to an amplitude detection circuit for generating output data responsive to the amplitude of an analog input signal and, more particularly, to such a circuit, of a digital construction, to generate digital output data.

An amplitude detection circuit is employed as an envelope detector of an analog input signal or a peak (or bottom) holder of an amplitude of the analog input signal. According to the prior art, the amplitude detection circuit includes an operational amplifier, a rectifier and a capacitor. The analog input signal is supplied to an input terminal of the operational amplifier whose output terminal is connected to the rectifier. The rectified signal derived from the rectifier is supplied to the capacitor, so that a detection signal is produced across the capacitor. The detection signal is supplied to a subsequent signal processor.

In a case where the subsequent signal processor is digitalized, an analog-to-digital converter converts the detection signal into digital data which, in turn, is supplied to the digitalized signal processor. In this case, two kinds of integrated circuit devices, an analog integrated circuit device used as the amplitude detection circuit and the second being a digital integrated circuit device used as the signal processor. Moreover, the analog integrated circuit device requires an external lead-out terminal for connecting the capacitor.

SUMMARY OF THE INVENTION

Therefore, an object of the present invention is to provide a digitalized amplitude detection circuit.

Another object of the present invention is to provide a digitalized envelope detector suitable for being used in a servo circuit for a pickup in a compact disk audio player.

An amplitude detection circuit, according to the present invention, comprises converter means for converting an analog input signal into first digital data. A storing means stores second digital data which is to be outputted to a comparing means for comparing the first and second digital data to produce a comparison output signal, taking either a first or second logic level in accordance with the magnitude therebetween. A first data-outputting means for outputting the first digital data or third digital data to the storing means. That is, the third digital data is the second digital data plus a first, the third digital data being outputted value when the comparison output signal takes the first logic level. A and second data-outputting means outputs the second digital data or fourth digital data to the storing means. The fourth digital data is the second digital data minus a second value, the fourth digital data being outputted when the comparison output signal takes the second logic level.

In a case where the amplitude detection circuit, according to the present invention, is employed as a peak holder or an envelope detector of peak values, the comparison signal takes the first logic level when the first digital data is equal to or larger than the second digital data and takes the second logic level when the first digital data is smaller than the second digital data. The first and second values take a positive value, respectively. Therefore, as the amplitude of the analog input signal becomes large, the magnitude of the data to be outputted is increased. When the amplitude of the analog input signal reaches its peak value and then begins to become smaller, the output data is maintained to take a magnitude corresponding to the peak value or lowered from that magnitude with a desired decreasing characteristic.

In a case where the circuit, according to the present invention, is employed as a bottom holder or a bottom envelope detector, the comparison output signal takes the first logic level when the first digital data is equal to or smaller than the second digital data and a second logic level when the first digital data is larger than the second digital data. The first and second values take a negative value, respectively. That is, the first data-outputting means outputs the first digital data or third digital data that is the second digital data minus the first value. The second data-outputting means outputs the second digital data or fourth digital data that is the second digital data plus the second value. Therefore, as the amplitude of the input signal becomes small, the magnitude of the output data is decreased. When the amplitude of the input signal reaches its bottom value and then begins to become larger, the output data holds a magnitude corresponding to the bottom value or increases from that magnitude with a desired increment characteristic.

Thus, the digitalized circuit, according to the present invention, performs a function of an envelope detector, a peak holder or a bottom holder, and is suitable for an integrated circuit device since no capacitor is required.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
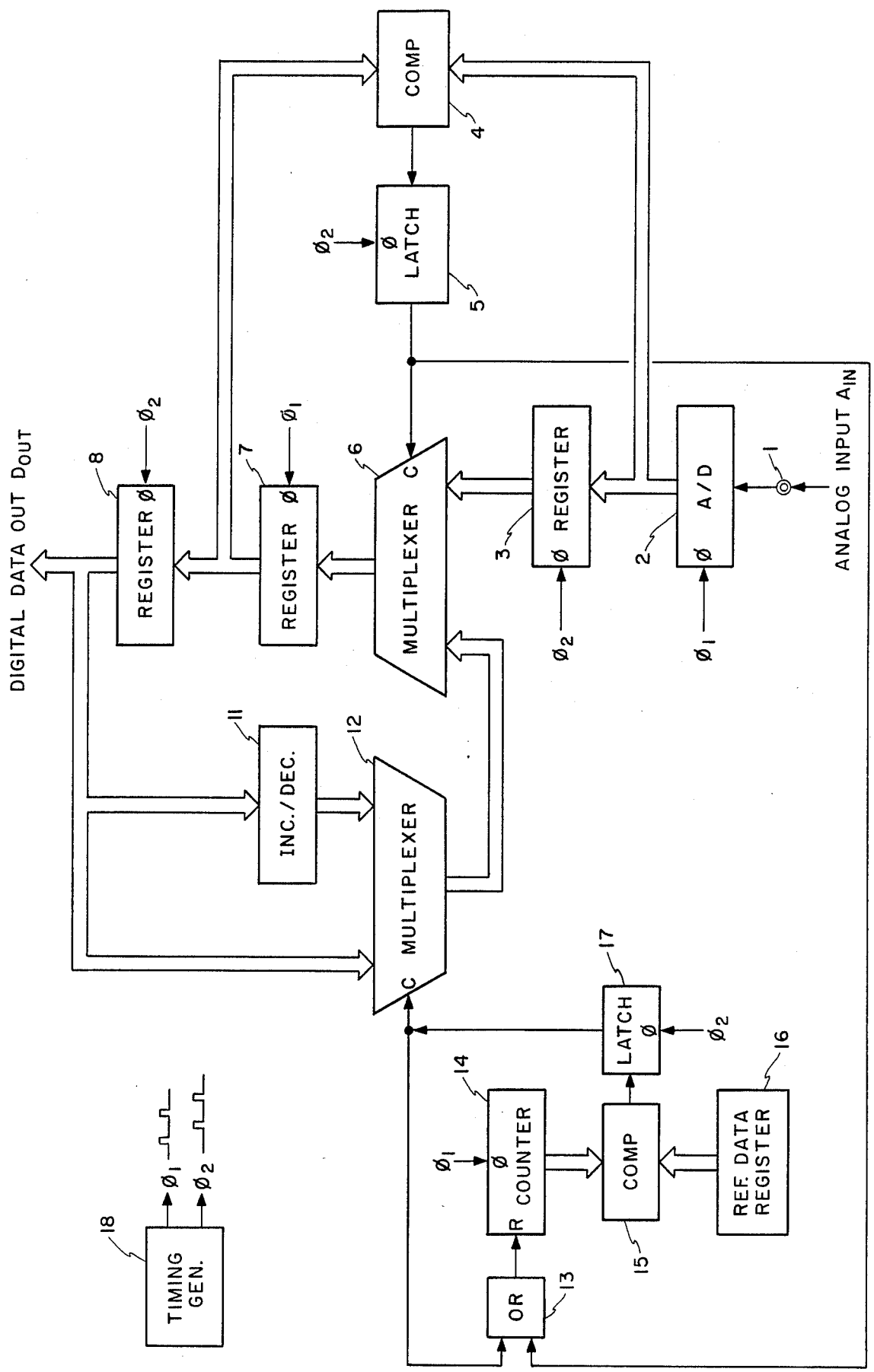
FIG. 1 is a block diagram showing an embodiment of the present invention.

FIG. 1 shows an envelope detector according to an embodiment of the present invention.

An analog input signal $A_{IN}$ is supplied via an input terminal 1 to an analog-to-digital converter (called hereinafter an "A/D converter") 2. The A/D converter 2 converts the analog signal $A_{IN}$ into digital data of four bits construction in synchronism with a first clock pulse train $\phi_1$ supplied to a clock terminal $\phi$ thereof. The converted digital data is supplied to a register 3 and a comparator 4. The register 3 introduces the supplied digital data in synchronism with a second clock pulse train $\phi_2$ supplied to clock terminal $\phi$. The first and second clock pulses $\phi_1$ and $\phi_2$ are generated by a timing generator 18. The relationship therebetween is that when one of them takes the high level, the other clock pulse takes the low level, as shown.

The data of the register 3 is supplied to a first set of input terminals of a multiplexer 6 whose second set of input terminals is supplied with data produced from a second multiplexer 12. The multiplexer 6 selects the data from the register 3 when a signal supplied to a control terminal C thereof takes the high level and selects the data from the multiplexer 12 when the signal takes the low level.

The selected data from the multiplexer 6 is introduced into a register 7 in synchronism with the first clock pulse $\phi_1$ supplied to a clock terminal $\phi$ thereof. The data of the register 7 is supplied to the comparator 4 and a register 8 which introduces the supplied data in synchronism with the second clock pulses $\phi_2$ supplied to its clock terminal $\phi$. The comparator 4 compares the two supplied data and produces a comparison output signal taking the high level or the low level in accordance with magnitude therebetween.

In a case of where the circuit as shown is employed as a peak envelope detector, the comparison output signal takes the high level when the data from the A/D converter 2 is equal to or larger than the data from the register 7 and the low level when the data from converter 2 is smaller than the data from the register 7.

In a case where the circuit as shown is employed as a bottom envelope detector, the comparison output signal takes the high level when the data from the A/D converter 2 is equal to or smaller than the data from the register 7 and the low level when the data from converter 2 is larger than the data from the register 7.

The data stored in the register 8 is employed as output digital data $D_{OUT}$, and further supplied to a first set of input terminals of the multiplexer 12 and to a block 11. The block 11 functions as an incrementing circuit that increases the output data $D_{OUT}$ by a first number having a positive value in a case of the bottom envelope detector, and as a decrementing circuit that decreases the output data $D_{OUT}$ by a second number having a positive value in a case of the peak envelope detector. In this embodiment, the increment (or decrement) circuit 11 adds (or subtracts) 1 with respect to the least significant bit of the output data $D_{OUT}$. The data derived from the increment (or decrement) circuit 11 is supplied to a second set of input terminals of the multiplexer 12. The multiplexer 12 selects the data from the increment (or decrement) circuit 11 when a high level signal is supplied to its control terminal C and selects the data from the register 8 when a low level signal is supplied to the control terminal C. The selected data is supplied to the multiplexer 6.

A counter 14 counts the first clock pulses $\phi_1$ supplied to a clock terminal $\phi$ thereof. Its count value is compared by a comparator 15 with reference data stored in a register 16. The comparator 15 produces a high level signal when the count value is equal to the reference data and a low level signal when they are different from each other. The signal produced by the comparator 15 is latched by a latched circuit 17 in synchronism with the second clock pulse $\phi_2$. The output of the latch circuit 17 is supplied to the control terminal C of the multiplexer 12. The outputs of the latch circuits 5 and 17 are supplied to an OR gate 13 whose output is supplied to a reset terminal R of the counter 14. Therefore, when any one of the outputs of the latch circuits 5 and 17 takes the high level, the counter 14 is reset and then takes an initial value. In this embodiment, each of the counter 14 and the register 16 has an eight bits construction.

Figure 2:
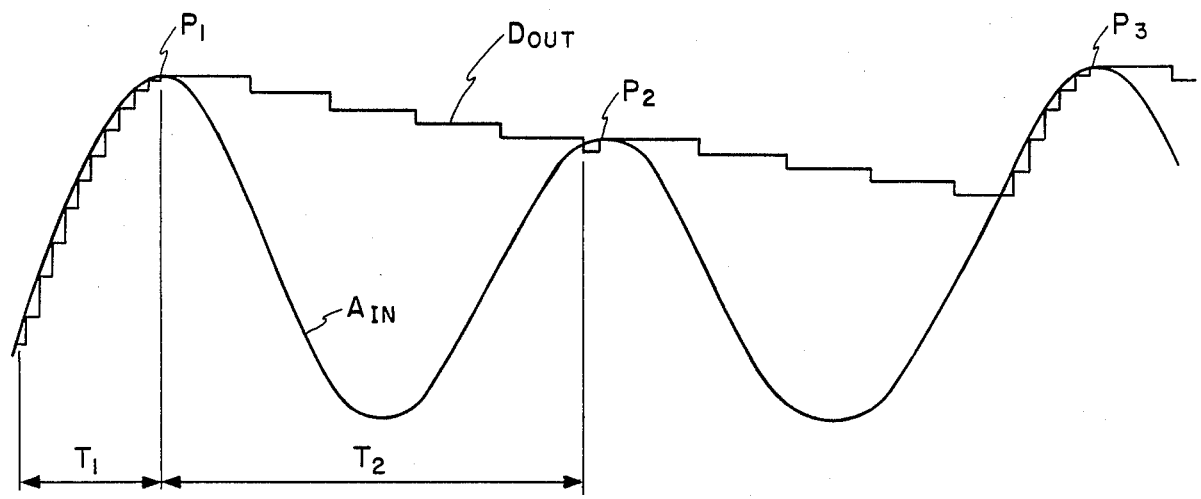
FIG. 2 is a signal waveform diagram of input and output signals in a case of employing the circuit shown in FIG. 1 as a peak envelope detector.

A circuit operation in a case of the peak envelope detector will be described below with reference to FIG. 2. The analog input signal $A_{IN}$ is represented by, for example, a sine wave signal having a variable amplitude, as shown in FIG. 2. This analog signal $A_{IN}$ is sampled in a cycle of the first clock signal $\phi_1$. The amplitude of the analog signal at the sampling time point is converted by the A/D converter 2 into digital data which is compared by the comparator 4 with the data of the register 7. As shown in FIG. 2, the amplitude of the analog signal $A_{IN}$ increases continuously until it reaches a first peak value $P_1$. Hence the comparator 4 produces the high level comparison signal. This high level is latched by the latch circuit 5 in synchronism with the second clock pulse $\phi_2$. The register 3 introduces the data from the A/D converter 2 in synchronism with the second clock pulse $\phi_2$. Accordingly, the multiplexer 6 selects and outputs the data from the register 3 in synchronism with the second clock pulses $\phi_2$.

The register 7 does not introduce, at this time, the data from the multiplexer 6, since it synchronizes the first clock pulses $\phi_1$. When the second clock pulse $\phi_2$ disappears and then the first clock pulse $\phi_1$ appears, the register 7 introduces the data from the multiplexer 6 and supplies it to the register 8 and the comparator 4. The A/D converter 2 samples again the amplitude of the analog signal $A_{IN}$ and converts it into digital data which is in turn supplied to the comparator 4. Thus, the comparator 4 compares the digital data corresponding to the amplitude of the signal $A_{IN}$ at a certain sampling time point and the digital data at a sampling point just before it.

In synchronism with the second clock pulses $\phi_2$, the register 3 introduces the data from the A/D converter 2 and the register 8 introduces the data from the register 7 to produce the output data $D_{OUT}$. Therefore, until the analog input signal $A_{IN}$ reaches the first peak value $P_1$, the data from the A/D converter 2 is larger than the data from the register 7. The latch circuit 5 latches the high level which is in turn supplied to the control terminal C of the multiplexer 6. The multiplexer 6 thereby selects the data from the register 3 irrespective of the data from the multiplexer 12. As a result, the magnitude of the output data $D_{OUT}$ increases within a period $T_1$ shown in FIG. 2.

When the amplitude of the input signal $A_{IN}$ becomes smaller than the first peak value $P_1$, the data from the A/D converter 2 also becomes smaller than the data from the register 7. Accordingly, the output of the latch circuit 5 is inverted to the low level in synchronism with the second clock pulses $\phi_2$, so that the multiplexer 6 selects the data from the multiplexer 12 in place of the register 3. At this time, the multiplexer 12 receives at its control terminal C the low level, since the count value of the counter 14 is different from the reference data in the register 16. Therefore, the multiplexer 12 selects the data from the register 8, i.e. the output data $D_{OUT}$, and supplies it to the multiplexer 6. Unless the counter 14 counts the first clock pulses $\phi_1$ up to the reference value, the comparator 15 produces the low level output. As a result, the register 8 holds the output data $D_{OUT}$ that takes the magnitude corresponding to the first peak value $P_1$ during a period determined by the cycle of the first clock pulses $\phi_1$ and the reference data.

When the count value of the counter 14 reaches the reference data in the register 16, the output of the comparator 15 changes to the high level that is in turn supplied to the control terminal C of the multiplexer 12 in synchronism with the second clock pulses $\phi_2$. Accordingly, the multiplexer 12 selects the data from the circuit 11 operating as a decrement circuit, so that the data from the multiplexer 12 is the output data $D_{OUT}$ minus one.

This data is introduced in the register 7 in synchronism with the first clock pulses $\phi_1$. Although the counter 14 is reset by the high level output of the latch circuit 17, the output level of the latch circuit 17 changes in synchronism with the second clock pulses $\phi_2$. Therefore and therefore the data from the decrementing circuit 11 is introduced into the register 7 before the multiplexer 12 selects the data from the register 8 in place of the circuit 11. The data from the register 7 is introduced into the register 8 in response to the second clock pulses $\phi_2$. As a result, the magnitude of the output data $D_{OUT}$ is decreased by one, as shown in FIG. 2.

Since the latch circuit 17 produces the low level output in response to the second clock $\phi_2$, the multiplexer 12 supplies the data from the register 8, i.e. the decreased output data, to the multiplexer 6. The output data $D_{OUT}$ holds the decreased magnitude until the count value of the counter 14 reaches the reference data. Thus, as long as the data from the A/D converter 2 does not become larger than the output data $D_{OUT}$, as shown by a period $T_2$ in FIG. 2, the output data $D_{OUT}$ is decreased from the magnitude corresponding to the first peak value $P_1$ with a desired decrement or attenuation characteristic determined by the decrement value of the circuit 11, the cycle of the first clock pulses $\phi_1$, and the reference data in the register 16.

As a result of decreasing the magnitude of the output data $D_{OUT}$ and increasing of the amplitude of the analog input signal $A_{IN}$, the data from the register 7 becomes smaller than the data from the A/D converter 2 at the end of the period $T_2$. Therefore, the latch circuit 5 supplies the high level to the control terminal C of the multiplexer 6 in response to the second clock pulses $\phi_2$. The data from the register 3 is thereby selected and supplied to the register 7. The circuit operation described in the period $T_1$ shown in FIG. 2 is carried out. Hence the output data $D_{OUT}$ takes the magnitude corresponding to the amplitude of the input signal $A_{IN}$. When the amplitude of the input signal $A_{IN}$ becomes smaller than a second peak value $P_2$, the output data $D_{OUT}$ is decreased from the magnitude corresponding to the second peak value $P_2$, as described in the period $T_2$ in FIG. 2.

As described above, the circuit shown in FIG. 1 functions as a peak envelope detector of the analog input signal $A_{IN}$. Moreover, it is digitalized to require no capacitor.

Figure 3:
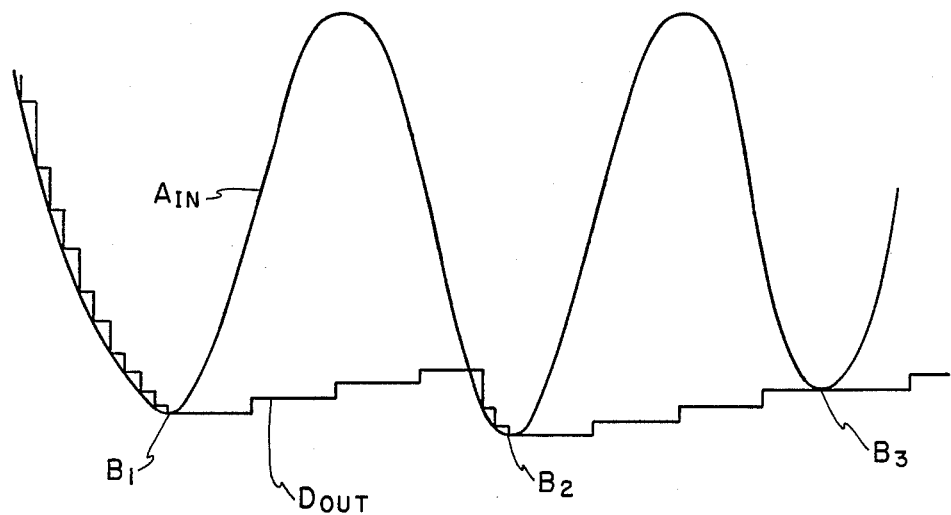
FIG. 3 is a signal waveform diagram of input and output signals in a case of employing the circuit shown in FIG. 1 as a bottom envelope detector.

In a case of employing the circuit shown in FIG. 1 as a bottom envelope detector of the analog input signal $A_{IN}$, as long as the data from the A/D converter 2 is smaller than the data from the register 7, the magnitude of the output data takes the magnitude of the amplitude of the input signal $A_{IN}$ at the sampling time point. When the amplitude of the input signal $A_{IN}$ becomes larger than a bottom value, the output data $D_{OUT}$ is increased from the magnitude corresponding to the bottom value with a increment characteristic determined by the increment value of the circuit 11, the cycle of the first clock pulses $\phi_1$, and the reference data in the register 16. As a result, an envelope output of bottom values $B_1$ to $B_3$ of the analog input signal $A_{IN}$ is derived, as shown in FIG. 3.

If the data from the register 8, i.e., the output data $D_{OUT}$, is supplied directly to the multiplexer 6, the magnitude of the output data $D_{OUT}$ is maintained over the whole period $T_2$. A peak holder or bottom holder is thus obtained. By making large the reference data in the register 16 and/or making small the increment (or decrement) value of the circuit 11, the change in the output data $D_{OUT}$ from the magnitude corresponding to the peak or bottom value is made small remarkably. Therefore, the circuit shown in FIG. 1 also operates as a peak holder or a bottom holder.

Figure 4:
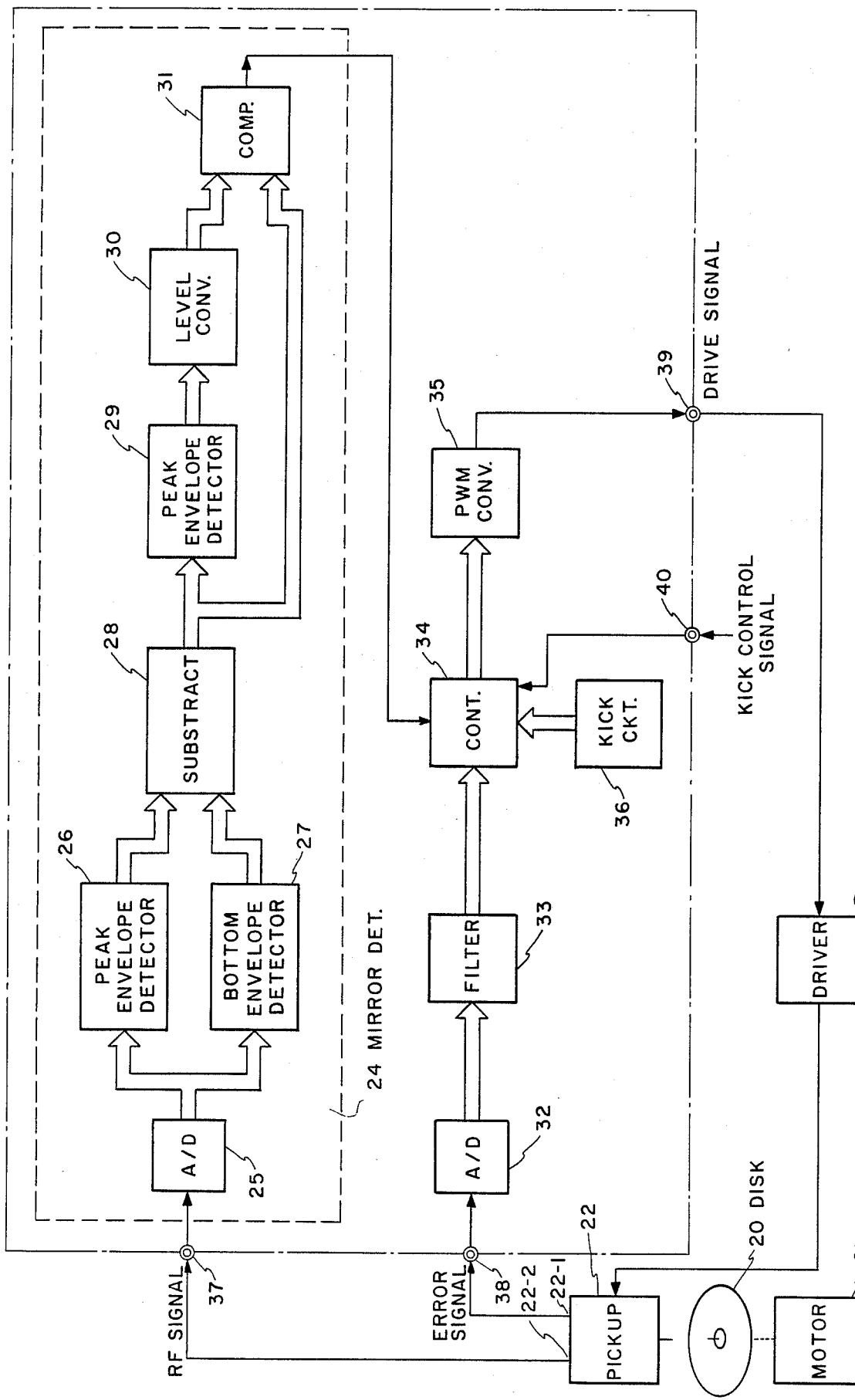
FIG. 4 is a block diagram showing one application of the present invention.

Referring to FIG. 4, there is shown a servo system for a pickup in a compact disk player, as one application of the present invention. A disk 20 is rotated by a motor 21. A pickup 22 irradiates a laser spot light on the surface of the disk 20 and detects reflected light to read out information which is recorded on the disk 20. Accordingly, it is necessary to control the location of the pickup 22 so that the laser spot light is irradiated precisely on each track of the disk 20 along which the information data is recorded. For this purpose, the pickup 22 produces at its first output terminal 22-1 an error signal which is representative of the deviation from the location on each track in response to the reflection light. The error signal is supplied to a first input terminal 38 of a servo IC (integrated circuit) 23 and then converted into digital data by an A/D converter 32.

This digital data is supplied to a digital filter 33 which eliminates high frequency components and noise signals contained in the digital error data. A controller 34 supplies data derived from the filter 33 to a PWM (Pulse Width Modulation) converter 35 upon a playback mode of the disk 20. The converter 35 generates a pulse signal having a modulated pulse width responsive to the receiving data and supplies it to an output terminal 39 as a drive signal. The drive signal is fed back to the pickup 22 via a driver 24. As a result, the location of the pickup 22 is controlled so that the laser spot light is irradiated on only a single track of the disk 20 which is then being reproduced.

Figure 5:
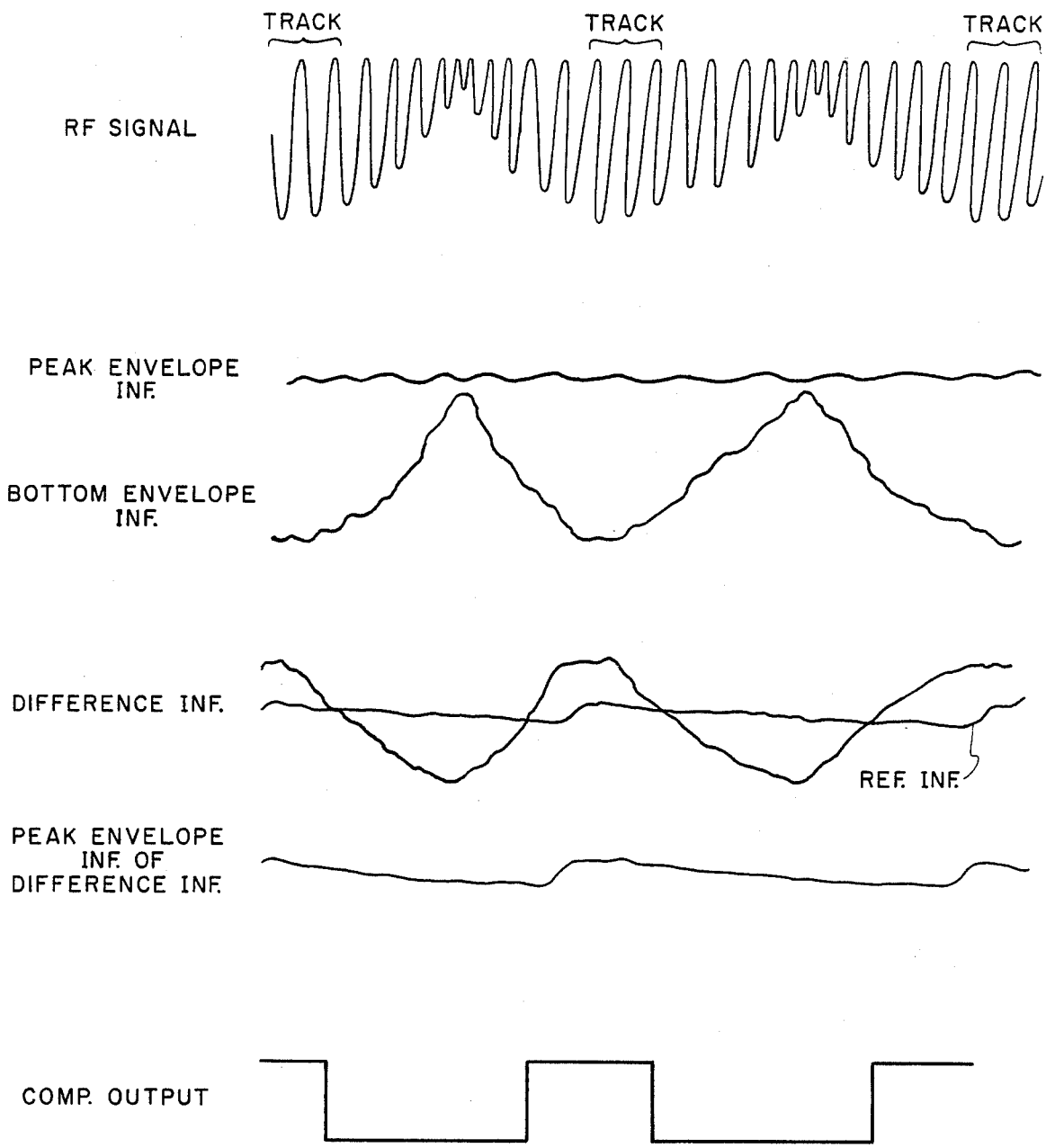
FIG. 5 is a signal waveform diagram of each output signal in a mirror detection circuit shown in FIG. 4.

The compact disk player has a random access function, and therefore the pickup 22 is required to quickly move to a desired track along which the accessed information is recorded. For this purpose, the pickup 22 generates at its second output terminal 22-2, a so-called RF signal which is representative of mirror a condition of the disk 22 in response to the reflection light. This RF signal is represented as a high frequency sine wave signal as shown in FIG. 5. The amplitude of this RF signal on each track is different from its amplitude between tracks.

Since the information data is recoded on each track, the amplitude of the RF signal has a maximum value. On the other hand, the data is not recorded between the tracks. Therefore the amplitude of the RF signal becomes small in accordance with the distance of the pickup 22 from the track and takes a minimum value at a midpoint between the tracks. When the pickup 22 approaches the track, the amplitude of the RF signal becames large again. The RF signal is supplied to a second input terminal 37 of the servo IC 23. The IC 23 includes a mirror detection circuit 24 which detects pickup passing times over the track of the disk 20 in response to the RF signal.

The mirror detection circuit 24 includes an A/D converter 25 which converts the RF signal into digital data. The digital RF data is supplied to a peak envelope detector 26 and a bottom envelope detector 27, according to the present invention. Each of the envelope detectors 26 and 27 has the circuit construction shown in FIG. 1. However, since the digital RF data is supplied, the A/D converter 2 shown in FIG. 1 is omitted. In the peak envelope detector 26, the reference data stored in the register 16 (FIG. 1) is "46". In the bottom envelope detector 27, the reference data takes "0C". Accordingly, the peak and bottom envelope detectors 26 and 27 generate respectively peak and bottom envelope information as shown in FIG. 5.

In order to facilitate the drawing, the peak and bottom information are denoted in FIG. 5 as an analog signal, respectively, but it should be noted that these information are digital data. The peak and bottom information are supplied to a subtracting circuit 28, so that the difference information therebetween is derived as shown in FIG. 5. This difference information is supplied as a first set of input signals for a comparator 31 and further to a peak envelope detector 29, according to the present invention. The detector 29 also includes the circuit construction shown in FIG. 1 except for the A/D converter 2, in which the reference data in the register 16 takes "FFF". Therefore, peak envelope information of the difference information is derived from the circuit 29. The information from the circuit 29 is supplied to a level converter 30 which produces reference information as shown in FIG. 5 and supplies it to a second set of input terminals of the comparator 31. It should be noted that the difference information, peak envelope information and reference information are also digital data. The comparator 31 compares the difference information from the subtracting circuit 28 and the reference information from the level converter. As a result, a comparison output signal is derived from the comparator 31, which changes to the high level each time that the pickup 22 passes over the track of the disk 20, as shown in FIG. 5. This comparison output signal is supplied to the controller 34.

In a random access operation, a kick control signal is supplied to a third input terminal 40 of the servo IC 23. In response to this signal, the controller 34 inhibits to receive the data from the filter 33 and introduces data from a kick circuit 36. The circuit 36 generates data for moving the pickup 22 in a radial direction across the disk 20. The controller 34 detects the comparison output signal of the comparator 31 and supplies the data from the kick circuit 36 to the PWM converter 35 until the pickup 22 moves to the position on a desired track. When the pickup 22 locates on the desired track, the controller 34 inhibits to receive the data from the circuit 36 and receives the data from the filter 33.

Thus, by employing an envelope detector according to the present invention, a servo circuit for the pickup 22 is derived as one integrated circuit device. Moreover, no capacitor is required.

Figure 6:
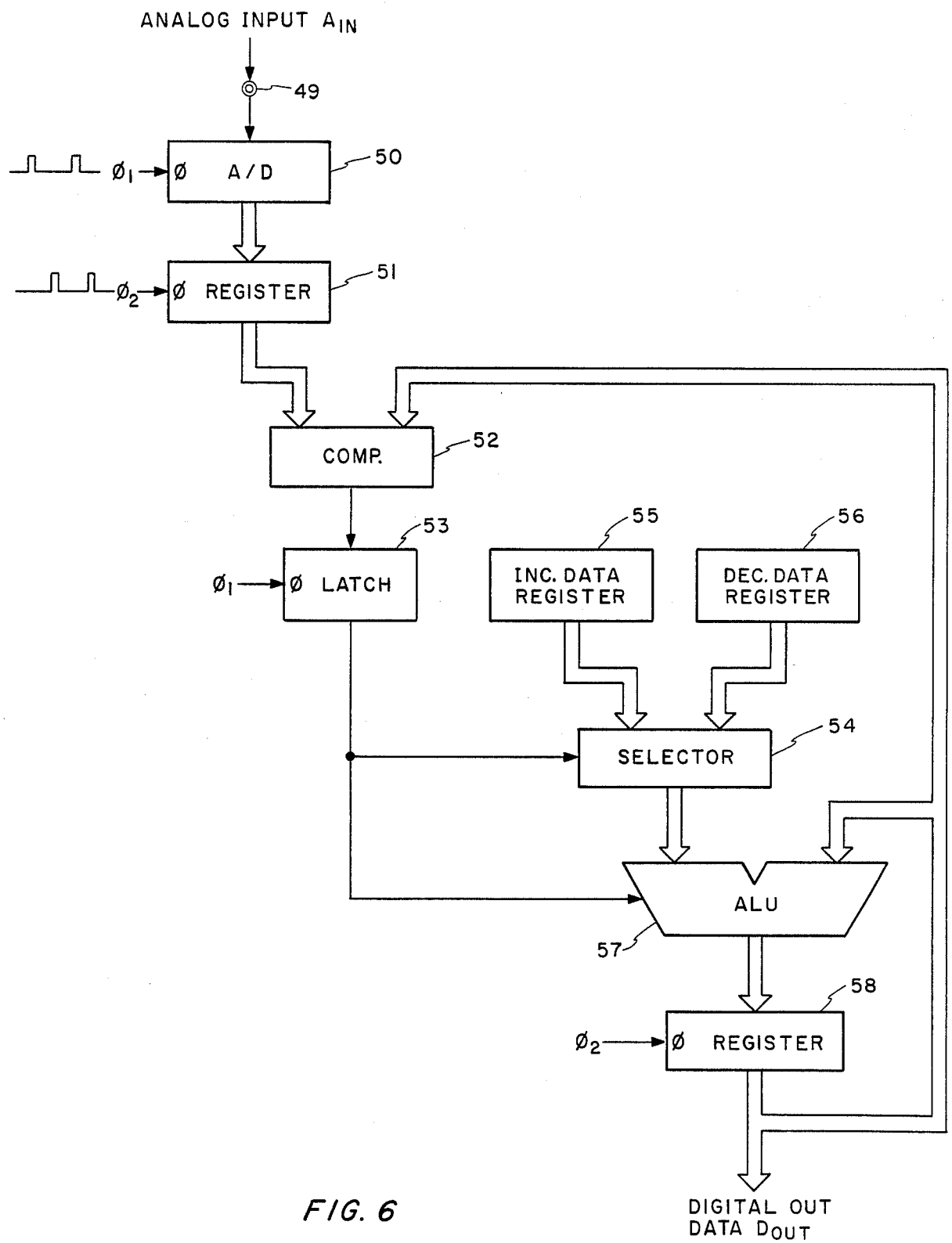
FIG. 6 is a block diagram showing another embodiment of the present invention.

Referring to FIG. 6, another embodiment of the present invention is shown. An analog input signal $A_{IN}$ supplied to an input terminal 49 is sampled and converted into digital data by an A/D converter 50 in synchronism with a first clock pulse $\phi_1$. This digital data is introduced into a register 51 in synchronism with a second clock $\phi_2$. The data from the register 51 is compared with digital output data $D_{OUT}$ by a comparator 52 which in turn produces a high level signal when the data of the register 51 is equal to or larger than the output data $D_{OUT}$ and produces a low level signal when the data from register 5 is smaller than the data $D_{OUT}$.

The output level of the comparator 52 is latched by a latch circuit 53 in response to the first clock pulse $\phi_1$ and then supplied to a selector 54 and an arithmetic logical unit 57. The selector 54 selects increment data stored in a register 55 when the output from the latch circuit 53 takes the high level and decrement data stored in a register 56 when the latched output takes the low level. The arithmetic logical unit 57 receives the output data $D_{OUT}$ and the selected data from the selector 54 and performs an adding operation therebetween when the latch output takes the high level and a subtracting operation therebetween when the latch output is the low level. The data from the unit 57 is introduced into a register in response to the second clock pulses $\phi_2$.

By setting into the register 55 the increment data corresponding to the maximum amplitude increase of the analog input signal $A_{IN}$ between the sampling time points and setting into the register 56 the decrement data corresponding to the difference between the adjacent peak values of the input signal $A_{IN}$, the circuit shown in FIG. 6 operates as a peak envelope detector of the analog input signal $A_{11}$. By setting into the register 56 the decrement data corresponding to the maximum amplitude decrease of the signal $A_{IN}$ between the sampling time points and setting into the register 55 the increment data corresponding to the difference between the adjacent bottom values, a bottom envelope detector is derived.

The present invention is not limited to the above embodiments, but may be modified and changed without departing from the scope and spirit of the invention.

What is claimed is:

1. A detection circuit comprising converting means for converting an analog input signal into first digital data, storing means for storing second digital data to be outputted, comparing means for comparing said first and second digital data to produce a comparison output signal taking a first level or a second logic level in accordance with a relationship in magnitude therebetween, first data-outputting means for outputting to said storing means said first digital data when said comparison output signal takes said first logic level, and second data-outputting means for outputting to said storing means third digital data that is different from said second digital data by a predetermined value when said comparison output signal takes said second logic level.

2. The circuit as claimed in claim 1, wherein said comparison output signal takes said first logic level when said first digital data is equal to or larger than said second digital data and said second logic level when said first digital data is smaller than said second digital data, and said predetermined value is a positive value.

3. The circuit as claimed in claim 1, wherein said comparison output signal takes said first logic level when said first digital data is equal to or smaller than said second digital data and said second logic level when said first digital data is larger than said second digital data, and said predetermined value is a negative value.

4. A detection circuit comprising an analog-to-digital converter converting an analog input signal into first digital data, means for storing second digital data to be outputted, a comparator comparing said first and second digital data and producing a comparison output that takes a first logic level when said first digital data is equal to or larger than said second digital data and a second logic level when said first digital data is smaller than said second digital data, means responsive to said first level of said comparison output for supplying said first digital data to said storing means, means responsive to said second level of said comparison output for generating a timer signal, means for producing third digital data that is said second digital data minus a predetermined value, and means responsive to said timer signal for supply said third digital data to said storing means.

5. A detection circuit comprising an analog-to-digital converter converting an analog input signal into first digital data, means for storing second digital data to be outputted, a comparator comparing said first and second digital data and producing a comparison output that takes a first level when said first digital data is equal to or smaller than said second digital data and a second level when said first digital data is larger than second digital data, means responsive to said first level of said comparison output for supplying said first digital output to said storing means, means responsive to said second level of said comparison output for generating a timer signal, means for producing third digital data that is said second digital data plus a predetermined value, and means responsive to said timer signal for supplying said third digital data to said storing means.

6. A circuit comprising an analog-to-digital converter converting an analog input signal into first digital data, means for storing second digital data to be outputted, a comparator comparing said first and second digital data and producing a comparison output taking a first logic level when said first digital data is equal to or larger than said second digital data and a second logic level when said first digital data is smaller than said second digital data, means responsive to said first logic level of said comparison output for producing third digital data that is said second digital data plus a first value, means for supplying said third digital data to said storing means, means responsive to said second logic level of said comparison output for producing fourth digital data that is said second digital data minus a second value, and means for supplying said fourth digital data to said storing means.

* * * * *